US007200826B2

(12) United States Patent
Andreev et al.

(10) Patent No.: US 7,200,826 B2
(45) Date of Patent: Apr. 3, 2007

(54) RRAM MEMORY TIMING LEARNING TOOL

(75) Inventors: Alexandre Andreev, San Jose, CA (US); Andrey Nikitin, Moscow (RU); Ranko Scepanovic, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 266 days.

(21) Appl. No.: 11/000,104

(22) Filed: Nov. 30, 2004

(65) Prior Publication Data

US 2006/0117284 A1    Jun. 1, 2006

(51) Int. Cl.
  *G06F 17/50*  (2006.01)
(52) U.S. Cl. .................................. 716/6; 716/4; 716/5
(58) Field of Classification Search ................. 716/4–6
  See application file for complete search history.

(56) References Cited

U.S. PATENT DOCUMENTS

| | | | | |
|---|---|---|---|---|
| 5,396,435 A * | 3/1995 | Ginetti | ............................ | 716/6 |
| 5,402,358 A * | 3/1995 | Smith et al. | .................... | 716/9 |
| 6,249,901 B1 * | 6/2001 | Yuan et al. | ..................... | 716/5 |
| 6,477,683 B1 * | 11/2002 | Killian et al. | ................... | 716/1 |
| 7,089,512 B2 * | 8/2006 | Iadanza et al. | ................. | 716/4 |
| 2006/0107247 A1 * | 5/2006 | Andreev et al. | ............... | 716/11 |
| 2006/0117281 A1 * | 6/2006 | Nikitin et al. | .................. | 716/5 |

\* cited by examiner

*Primary Examiner*—Vuthe Siek
*Assistant Examiner*—Naum Levin
(74) *Attorney, Agent, or Firm*—Luedeka, Neely & Graham, P.C.

(57) ABSTRACT

A method of generating a timing model for a customer memory configuration, by generating a plurality of template memory netlists for a given RRAM design. Timing models for the template memory netlists are produced and stored in a first database. The template memory netlists are stored in a second database. A netlist for the customer memory configuration is generated and compared to the template memory netlists to find a match. When a match is found, one of the timing models that is associated with the matching template memory netlist is used as the timing model for the customer memory configuration. When a match is not found, two of the template memory netlists that bound the customer netlist are found, according to at least one parameter, and the timing model for the customer memory configuration is interpolated based on the two bounding template memory netlists.

4 Claims, 2 Drawing Sheets

LEARNING AND DATABASE CONSTRUCTION FLOW

LEARNING AND DATABASE CONSTRUCTION FLOW

TIMING MODEL GENERATION FLOW

RRAM MEMORY TIMING LEARNING TOOL

FIELD

This invention relates to the field of integrated circuit fabrication. More particularly, this invention relates to memory design for integrated circuits.

BACKGROUND

Integrated circuits are often formed using an application specific integrated circuit architecture, which tends to reduce the design costs of the integrated circuit by using predetermined logic blocks in a somewhat customized arrangement to produce an integrated circuit according to a customer's specifications. One aspect of such a customizable integrated circuit design is referred to as RRAM.

RRAM (Reconfigurable RAM) contains sets of memories of the same type that are placed compactly within a memory matrix. An RRAM, as the term is used herein, is a megacell that can be considered as a set of memories with built-in self testing and built-in self correction. RRAM also contains sets of embedded tools that are used for mapping arbitrary logical customer memory designs to the physical memories in the matrix. However, memory timing model generation tends to be a relatively difficult aspect of this type of RRAM design.

Each RRAM design typically contains several RRAMs. At the stage of memory placement during the design process, memories of the customer's netlist are mapped to the customizable standardized memories of the RRAMs. Then the RRAM megacells are configured in accordance with the resulting memory mapping. The configured RRAM is called a tiling netlist. After the tiling netlist is constructed, the issue of the customer memory timing model generation arises. In order to generate the timing model for some customer memories, we need to make the estimation of the tiling netlist timing.

The number of different memory mappings of the customer memories to the given RRAM is so high, that it is not reasonable to consider all of the different configurations of the memory mapping, and thus it is not reasonable to create the customer memory timing models for all of the different cases.

What is needed, therefore, is a learning method of timing estimation, that overcomes, at least in part, problems such as those described above.

SUMMARY

The above and other needs are met by a method of generating a timing model for a customer memory configuration, by generating a plurality of template memory netlists for a given RRAM design. Timing models for the template memory netlists are produced and stored in a first database. The template memory netlists are stored in a second database. A netlist for the customer memory configuration is generated and compared to the template memory netlists to find a match. When a match is found, one of the timing models that is associated with the matching template memory netlist is used as the timing model for the customer memory configuration. When a match is not found, two of the template memory netlists that bound the customer netlist are found, according to at least one parameter, and the timing model for the customer memory configuration is interpolated based on the two bounding template memory netlists.

In this manner, the timing database can be kept in the compact binary mode, so that dealing with this database does not require a great length of time. The timing estimation of the tiling netlist for any memory mapping process may actually take a relatively small amount of time, in comparison with current practices. This is very helpful when using memory mapping tools that can examine a large number of different configurations of the memory mapping and then run the timing estimator for each configuration, and thus the embodiments of the present method can choose a memory mapping configuration that is optimized, such as from the point of view of timing models.

Another advantage of the methods described herein is that they do not require technology libraries or timing delay evaluation tools on the customer side. This advantage makes it possible for the customer to run the memory timing model generation in house, and the RRAM developer need not provide the customer with any large technology libraries or require the customer to purchase expensive timing delay evaluation tools.

In various embodiments, the step of comparing the customer netlist to the template memory netlists is accomplished individually for each routing wire in the customer netlist. In some embodiments, the first database and the second database are a single database. Preferably, the at least one parameter includes at least one of a size of a bounding box of a routing wire in the netlist and a total load of all pins connecting to the routing wire in the netlist.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
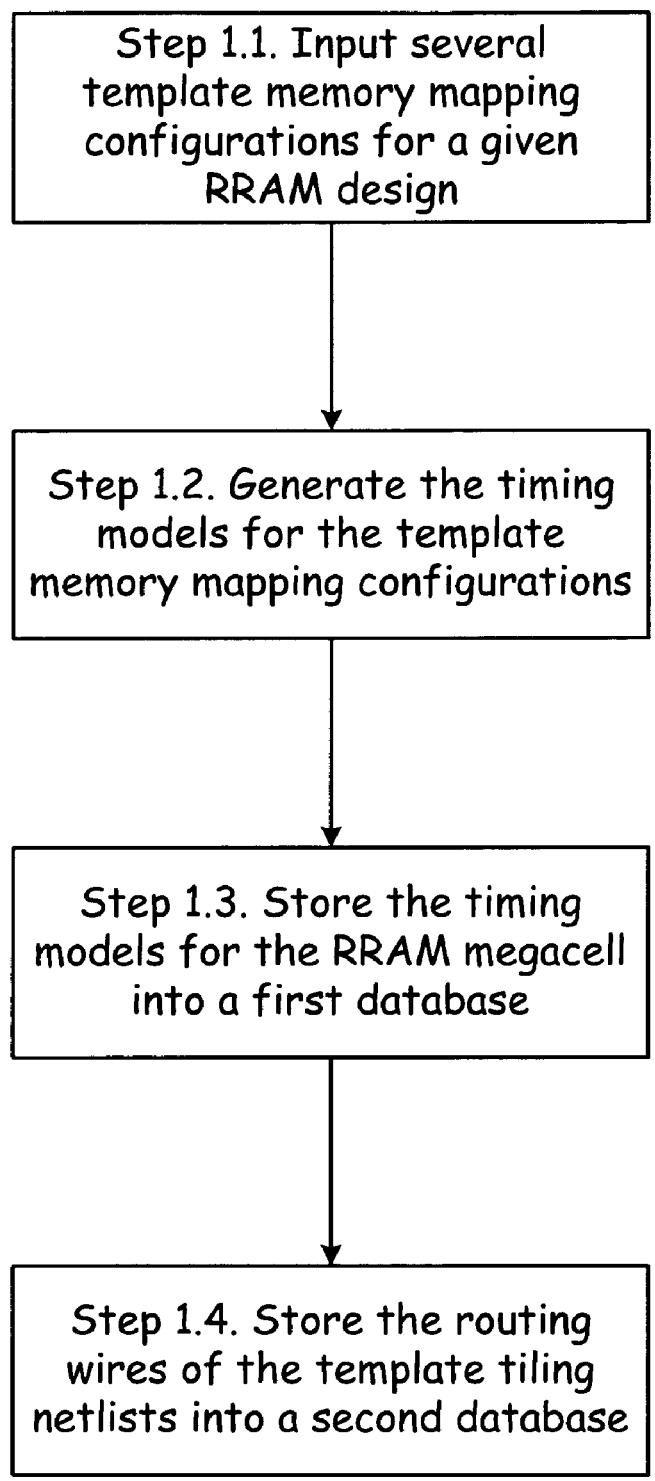
FIG. 1 is a flow chart of a learning and database construction flow according to a preferred embodiment of the invention.

As used, herein, the terms "timing estimation" and "timing model generation" have the same meaning and are used interchangeably. The method described herein makes possible: (1) an examination of a finite number of different tiling netlists—called template tiling netlists—for one RRAM and for sets of customer memories, (2) the collection of the timing models of template cases into a database, and (3) that building of the timing model for any given case of memory mapping, or any given tiling netlist, using the information from this database.

One advantage of the preferred methods according to the present invention is that the timing database can be kept in the compact binary mode, so that dealing with this database does not require a great length of time. The timing estimation of the tiling netlist for any memory mapping process may actually take a relatively small amount of time, in comparison with current practices. This is very helpful when using memory mapping tools that can examine a large number of different configurations of the memory mapping and then run the timing estimator for each configuration, and thus the embodiments of the present method can choose a memory mapping configuration that is optimized, such as from the point of view of timing models.

Another advantage of the methods described herein is that they do not require technology libraries or timing delay evaluation tools. This advantage makes it possible for the customer to run the memory timing model generation in house, and the fabricator need not provide the customer with any large technology libraries or require the customer to purchase expensive timing delay evaluation tools.

The RRAM tiling netlist preferably consists of the predetermined RRAM and variable routing. The predetermined RRAM is preferably a megacell with known timing parameters. The timing model of the RRAM megacell is preferably fixed, and does not depend on the memory mapping configuration. Thus, it can be stored statically in some database. The RRAM megacell preferably has built-in logics and flip flops that are used in the tiling netlist. The input pins and output pins of these cells are preferably connected to the corresponding inputs and outputs of the RRAM. The process of configuring the RRAM is preferably reduced to the construction of the routing. This variable routing depends at least in part on the memory mapping of the customer memories to the given RRAM. During the variable routing construction, some inputs of the RRAM are connected with some outputs of the RRAM by routing wires. In addition, some inputs of the RRAM are preferably connected to power or ground nets.

The problem of estimating the timing for the given tiling netlist is equivalent to the problem of estimating the ramp time and load of the routing wires that take part in the routing. The overall process of the learning timing estimation of the netlist can be viewed as having two flows.

The first flow is the learning and database construction. This flow is preferably processed one time for each RRAM by the RRAM developer. The RRAM developer preferably creates several of the most typical (template) cases of memory mappings, and builds the corresponding template tiling netlists. Then the RRAM developer runs some delay evaluation tools and obtains the timing models for these template tiling netlists. The obtained timing models are preferably stored in two databases, which are designated as the RRAM database and the routing wires database.

The second flow deals with the timing model generation for the given case of mapping the customer memories to the given RRAM. This flow is preferably processed by the customer. In this flow, the database that was built for the template cases is opened. The timing model for the customer memory mapping case is generated. If the customer memory mapping case is not covered within the template memory mapping cases, then the customer reports it to the RRAM developer, who carries out the first flow one more time for the given customer case, and thereby expands the template cases database with a new case.

The two flows as generally outlines above are described in more detail below.

Learning and Database Construction Flow

The first flow is described with reference to FIG. 1.

Step 1.1. Input several template memory mapping configurations for a given RRAM design. These memory mappings are preferably generated by the RRAM developer, or may alternately be provided by the customer.

Step 1.2. Generate the timing models for the template memory mappings using delay evaluation tools on the various template tiling netlists.

Step 1.3. Store the timing models for the RRAM megacell into a first database, which preferably does not depend on the specific case of the memory mapping configuration.

Step 1.4. Store the routing wires of the template tiling netlists into a second database.

Timing Models Generation Flow

Figure 2:
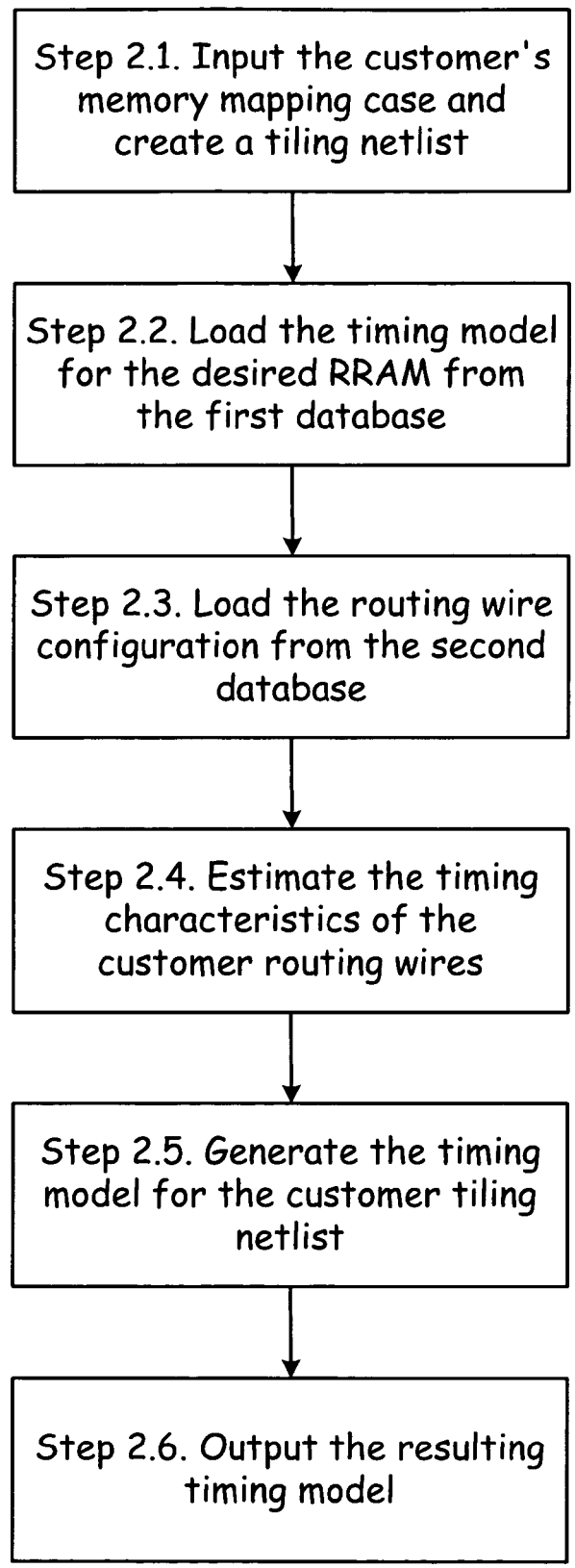
FIG. 2 is a flow chart of a timing model generation flow according to a preferred embodiment of the invention.

The second flow is described with reference to FIG. 2.

Step 2.1. Input the customer's specific memory mapping case, and create a tiling netlist for the case.

Step 2.2. Load the timing model for the desired RRAM from the appropriate first database, as created at step 1.3.

Step 2.3. Load the routing wires configuration from the template tiling netlists stored in the appropriate second database, as created at step 1.4.

Step 2.4. Estimate the timing characteristics of the routing wires of the customer tiling netlist using the database loaded in step 2.3.

Step 2.5. Generate the timing model for the customer tiling netlist using the model loaded from step 2.2 and the routing wires characteristics obtained in step 2.4.

Step 2.6. Output the resulting timing model.

Steps 1.4 and 2.4 as described above are next described in greater detail, including what should be stored in the template routing wires database of step 1.4, and how to estimate the characteristics of the routing wires of the customer tiling netlist using this database, as given in step 2.4.

Storing the Routing Wires Database

Each routing wire preferably has one driver cell, which is that cell which has an output pin that is connected to this wire, and one or more connected cells, which are the cells that have input pins that are connected to this wire. For each routing wire of each template tiling netlist, the following information is preferably stored in the database:

1) The cell type and the corresponding output pin of the driver cell.

2) The cell types and the corresponding input pins of the connected cells.

3) The coordinates of the connected pins relative to the coordinates of the driver pin. To the extent that the driver cell and the connected cells are the cells of the RRAM, these cells have fixed positions. If (XC,YC) are coordinates of a given connected pin and (XD, YD) are coordinates of the driver pin, then the relative coordinates of the connected pin are (XC-XD, YC-YD).

4) The size of the bounding box of the wire. The bounding box of the wire is preferably the minimal possible virtual rectangular that contains all the pins connected to this wire.

5) The total load of all the pins connected to the wire, or in other words the sum of all of the connected pins' loads.

6) The timing characteristics of the wire, such as ramp time, load, and interconnection delays.

The routing wires database preferably contains the indexes or hash tables for rapidly searching for wires within the database by a given combination of inputs, such as: 1); 1), 2) and 3); and 1), 4) and 5), where the numbers in this list refer to the reference numbers of the information that is stored in the database, as enumerated above. Searching for wires in the routing wires database is preferably used extensively in the customer timing model generation flow.

Estimation of the Timing Characteristics of a Routing Wire in the Customer Tiling Netlist Let us consider some routing wire W of the customer tiling netlist, which wire is called the customer routing wire herein.

The template routing wires database is searched for a match. In this database, we try to find the template wire with the same 1), 2) and 3) (using the reference numbers from the enumerated list above) that the customer routing wire W has. If the search is successful, then we assign the timing characteristics 6) of the matching template wire to the customer routing wire W under consideration. To the extent that the given RRAM: (1) has a regular structure, meaning that it consists of the equivalent blocks or modules shifted from each other, (2) the structures of these blocks are also regular, and (3) the number of the different cell types used in the given RRAM is relatively small, the procedure of searching the template wire by 1), 2) and 3) tends to be successful in most cases.

However, if there is no success in finding an appropriate match, than we preferably search two template wires W1 and W2 in the template database, such that: (1) these two wires W1 and W2 have the same 1) that the customer wire W has; (2) the values of the 4) and 5) of wires W1 and W2 are as close as possible to the values of 4) and 5) of the customer wire W; (3) the value of 4) of the customer wire W preferably has a value between the value of 4) of the wire W1 and the value of 4) of the wire W2; and (4) the value of 5) the customer wire W preferably has a value between the value of 5) of the wire W1 and the value of 5) of the wire W2.

Then a linear approximation of the timing characteristics of the customer wire W is made, relying on the timing characteristics 6) of the two found template wires W1 and W2.

If most of the routing wires of the customer tiling netlist do not match a corresponding template routing wire having the same 1), 2) and 3) in the routing wires database, then the timing model generation flow preferably sends a request to the learning and database construction flow (or in other words the customer sends a request to the RRAM developer) to include the customer case into the existing set of template cases.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of generating a timing model for a customer memory configuration, the method comprising the steps of:
   generate a plurality of template memory netlists for a given RRAM design,
   produce timing models for the template memory netlists,
   store the timing models in a first database,
   store the template memory netlists in a second database,
   generate a netlist for the customer memory configuration,
   compare the customer netlist to the template memory netlists to find a match,
   when the match is found, use one of the timing models that is associated with the matching template memory netlist as the timing model for the customer memory configuration, and
   when the match is not found, find two of the template memory netlists that bound the customer netlist according to at least one parameter, and interpolate the timing model for the customer memory configuration based on the two bounding template memory netlists.

2. The method of claim 1, wherein the step of comparing the customer netlist to the template memory netlists is accomplished individually for each routing wire in the customer netlist.

3. The method of claim 1, wherein the first database and the second database are a single database.

4. The method of claim 1, wherein the at least one parameter includes at least one of a size of a bounding box of a routing wire in the netlist and a total load of all pins connecting to the routing wire in the netlist.

* * * * *